United States Patent
Fukamura et al.

[19]

[11] Patent Number: 6,121,675

[45] Date of Patent: Sep. 19, 2000

[54] SEMICONDUCTOR OPTICAL SENSING DEVICE PACKAGE

[75] Inventors: Hajime Fukamura; Akio Izumi, both of Nagano, Japan

[73] Assignee: Fuji Electric Co., Ltd., Japan

[21] Appl. No.: 09/153,741

[22] Filed: Sep. 15, 1998

[30] Foreign Application Priority Data

Sep. 22, 1997 [JP] Japan .................................. 9-256486

[51] Int. Cl.[7] ................................................ H01L 23/06
[52] U.S. Cl. ...................... 257/680; 257/687; 257/729; 257/791
[58] Field of Search .................................. 257/680, 681, 257/687, 729, 730, 791; 438/116

[56] References Cited

U.S. PATENT DOCUMENTS

| | | | |
|---|---|---|---|
| 4,710,797 | 12/1987 | Tanaka | 257/681 |
| 4,723,156 | 2/1988 | Okuaki | 257/681 |
| 4,766,095 | 8/1988 | Hiroshi | 438/116 |
| 4,801,998 | 1/1989 | Okuaki | 257/681 |
| 4,961,106 | 10/1990 | Butt et al. | 257/681 |
| 5,068,713 | 11/1991 | Toda | 257/681 |
| 5,399,805 | 3/1995 | Tyler et al. | 257/680 |
| 5,962,810 | 10/1999 | Glenn | 257/680 |

FOREIGN PATENT DOCUMENTS

| | | | |
|---|---|---|---|
| 62-020359 | 1/1987 | Japan | 257/681 |
| 62-174956 | 7/1987 | Japan | 257/681 |
| 63-133654 | 6/1988 | Japan | 257/681 |

*Primary Examiner*—David Hardy
*Attorney, Agent, or Firm*—Morrison Law Firm

[57] ABSTRACT

A semiconductor optical sensing device includes an insulating casing containing a semiconductor optical sensor chip fixed in the bottom thereof. Transparent silicone gel fills the interior of the casing and covers the sensor chip. A transparent plate covers both the sensor chip and the silicone gel. Holes in the casing allow expansion and contraction of the silicone gel without disturbing the optical properties of the sensor chip, and without permitting the formation of bubbles in the silicone gel.

18 Claims, 10 Drawing Sheets

SEMICONDUCTOR OPTICAL SENSING DEVICE PACKAGE

BACKGROUND OF THE INVENTION

The present invention relates to semiconductor optical sensing devices and, more particularly, to an improved casing for such devices.

According to the prior art, semiconductor optical sensing devices, such as charge coupled devices (CCD), include a ceramic casing in which a semiconductor optical sensor chip is sealed. Typical prior art semiconductor optical sensing devices are shown in FIGS. 9(a), 9(b) and 10(a), 10(b). Although the prior art will be explained hereinafter in connection with a CCD image sensor, the optical sensor may be any type of optical sensing device such as, for example, a photodiode or an infrared sensor.

Referring now to FIG. 9(b), the prior art ceramic casing includes a ceramic substrate 59, lead frames 55, and a ceramic outer frame 60. A semiconductor optical sensor chip 58 is bonded onto the ceramic substrate 59. The lead frames 55 serve also as lead pins. The ceramic outer frame 60 works as an insulating frame for fixing a protective transparent plate 57 over the opening of the casing.

A recess portion in the bottom of the ceramic substrate 59 receives the semiconductor optical sensor chip 58. The semiconductor optical chip 58 is die-bonded onto the bottom of the recess portion. The lead frames 55 are patterned corresponding to the internal terminals of the sensor chip 58. The lead frames 55 are fixed between the ceramic substrate 59 and the ceramic outer frame 60 with an adhesive or a glass of low melting point 61. Each internal terminal of the sensor chip 58 is connected to the corresponding lead frame 55 via a bonding wire 56.

Transparent plate 57 is fixed on the upper face of the ceramic outer frame 60 with low-melting-point glass or adhesive 61 such that the transparent plate 57 closes the open end of the ceramic casing and seals the sensor chip 58 in the ceramic casing. The internal space of the ceramic casing is empty.

In the sensing device structure described above, the sensor chip 58 detects the light transmitted through the transparent plate 57 and outputs signals indicative of the detected light through the lead frames 55.

Referring now to FIG. 10(b), a CCD image sensor is in a surface mounting-type ceramic casing. The internal space of the casing is filled with a transparent resin.

A plastic substrate 63 has a semiconductor optical sensor chip 58 bonded onto its central part. Metal wiring patterns 65, corresponding to the internal terminals of the sensor chip 58, are formed on the plastic substrate 63. The metal wiring patterns 65 extend to the vicinity of the area where the sensor chip 58 is bonded.

The end portions of the metal wiring patterns 65 on the side of the sensor chip 58 are bonded to the bonding pads of the sensor chip 58 via bonding wires 56. The metal wiring patterns 65 are connected, via through-holes bored in the peripheral portion of the plastic substrate 63, to mounting terminals 66 patterned on the back surface of the plastic substrate 63. An insulating outer frame 64 on the metal wiring patterns 65 is bonded to the plastic substrate 63 with adhesive 68 such that the insulating outer frame 64 surrounds the wire-bonding portions of the metal wiring patterns 65 and the sensor chip 58. The space surrounded by the insulating outer frame 64 is filled with transparent resin 69 such that the transparent resin 69 completely seals the sensor chip 58 and the bonding wires 56. A transparent plate 57 is fixed to the outer portion of frame 64 with transparent resin or adhesive 70.

The basic principle of the optical sensing device shown in FIGS. 10(a) and 10(b) is same with that of the optical sensing device shown in FIGS. 9(a) and 9(b). The optical sensing device of FIGS. 10(a) and 10(b) is filled with the transparent resin 69, while the internal space of the casing in the optical sensing device of FIGS. 9(a) and 9(b) is empty.

In the optical sensing device of FIGS. 9(a) and 9(b), the internal space of the ceramic casing should be filled with an inert gas, to prevent deterioration of the sealed sensor chip or the bonding wires. However, even when the internal space of the casing is filled with an inert gas, the optical sensing device will inevitably deteriorate, if the temperature and the humidity are not controlled precisely.

Further, leakage tests conducted after the inert gas injection increases the package costs.

In the surface-mounting-type casing of FIGS. 10(a) and 10(b), the transparent resin 69 protects the sensor chip 58 and seals the casing. However, the transparent resin 69 expands or contracts due to the temperature changes around and in the casing. The expansion and contraction of the transparent resin 69 cause separation of the transparent resin 69 and the casing and bubbles in the transparent resin 69. In some cases, the bonding wires 56 are broken by the expansion and contraction of the transparent resin 69.

Moreover, the expansion and contraction of the transparent resin 69 changes the distance between the upper face of the transparent plate 57 and the upper face of the sensor chip 58. This distance change causes change in the optical properties of the sensing device.

OBJECTS AND SUMMARY OF THE INVENTION

In view of the foregoing, it is an object of the invention to provide an optical sensing device which obviates the foregoing problems.

It is another object of the invention to provide an optical sensing device having a sealing structure which facilitates improved resistance to deterioration of the mechanical properties and reduces changes in the optical properties of the sensor chip.

It is still another object of the invention to provide an optical sensing device which can be used under severe conditions such as in a motor vehicle.

A semiconductor optical sensing device includes an insulating casing containing a semiconductor optical sensor chip fixed in the bottom thereof. Transparent silicone gel fills the interior of the casing and covers the sensor chip. A transparent plate covers both the sensor chip and the silicone gel. Holes in the casing allow expansion and contraction of the silicone gel without disturbing the optical properties of the sensor chip, and without permitting the formation of bubbles in the silicone gel.

According to an embodiment of the invention, there is provided a semiconductor optical sensing device comprising: an insulating casing, wiring extending from the inside to the outside of the casing, a semiconductor optical sensor chip fixed inside the casing, a plurality of terminals disposed on the sensor chip, connecting means for connecting the terminals and the wiring, a quantity of transparent filler, the filler filling the casing and covering an upper face of the sensor chip, a transparent plate disposed above the sensor chip, the transparent filler being interposed between the sensor chip and the transparent plate, and at least one hole communicating between the transparent filler and the environment, whereby expansion and contraction of the transparent filler is enabled without disturbing the semiconductor optical sensor chip.

According to a feature of the invention, there is provided a semiconductor optical sensing device comprising: an insulating casing, wiring extending from the inside to the outside of the casing, a semiconductor optical sensor chip fixed inside the casing, a plurality of terminals on the sensor chip, connecting means for connecting the terminals and the wiring, a quantity of transparent filler, the filler filling the casing and covering the upper face of the sensor chip, and a transparent plate disposed above the sensor chip with the transparent filler interposed between the transparent plate and the sensor chip such that a part of the upper surface of the transparent filler is not in contact with the transparent plate and the part of the upper surface is exposed to the environment.

According to an aspect of the invention, there is provided a semiconductor optical sensing device which includes an insulating casing, wiring means extended from the inside to the outside of the casing, a semiconductor optical sensor chip fixed within the casing, terminal means disposed on the sensor chip, connecting means connecting the terminal means and the wiring means, a quantity of transparent filler filling the casing and covering the upper face of the sensor chip, a transparent plate disposed above the sensor chip, with the transparent filler interposed therebetween, and holes in the bottom of the casing communicating with the transparent filler.

Advantageously, the transparent filler is exposed to the environment through the holes.

Advantageously, a part of the upper surface of the transparent filler is not in contact with the transparent plate and the part of the upper surface is exposed to the environment.

According to another aspect of the invention, there is provided a semiconductor optical sensing device which includes an insulating casing, wiring extended from the inside to the outside of the casing, a semiconductor optical sensor chip fixed within the casing, a plurality of terminals disposed on the sensor chip, connecting means connecting the terminals and the wiring, a quantity of transparent filler filling the casing and covering the upper face of the sensor chip, and a transparent plate disposed above the sensor chip with the transparent filler interposed therebetween such that a part of the upper surface of the transparent filler is not in contact with the transparent plate and the part of the upper surface is exposed to the environment.

According to a still further aspect of the invention, there is provided an optical package comprising: a concave casing, an optical device in a bottom of the casing, a transparent filler covering the optical device, a transparent plate atop the transparent filler aligned over the optical device, whereby the optical device is enabled to interact optically with an exterior environment, a gap communicating between the exterior environment and the transparent filler, and the gap permitting expansion and contraction of the transparent filler without distorting optical properties of the transparent plate and the transparent filler.

Advantageously, the semiconductor optical sensing device further includes support columns projecting from the casing and supporting the transparent plate.

Advantageously, the semiconductor optical sensing device further includes a thin film disposed on the bottom surface of the casing and covering the holes.

Advantageously, the semiconductor optical sensing device further includes coating films which coat the surface portions of the transparent filler in the holes.

Advantageously, transparent silicone gel is used for the transparent filler.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1(*b*) is a cross-sectional view taken along line A—A of FIG. 1(*a*).

FIG. 2(*b*) is a cross-sectional view taken along line B—B of FIG. 2(*a*).

FIG. 3(*b*) is a cross-sectional view taken along line C—C of FIG. 3(*a*).

FIG. 4(*b*) is a cross-sectional view taken along line D—D of FIG. 4(*a*).

FIG. 5(*b*) is a cross-sectional view taken along line E—E of FIG. 5(*a*).

FIG. 6(*b*) is cross-sectional view taken along line F—F of FIG. 6(*a*).

FIG. 7(*b*) is a cross-sectional view taken along line G—G of FIG. 7(*a*).

FIG. 8(*b*) is cross-sectional view taken along line H—H of FIG. 8(*a*).

FIG. 9(*b*) is a cross-sectional view taken along line I—I of FIG. 9(*a*).

FIG. 10(*b*) is a cross-sectional view taken along line J—J of FIG. 10(*a*).

DETAILED DESCRIPTION OF THE PREFERRED EMBODIMENTS

Figure 1:
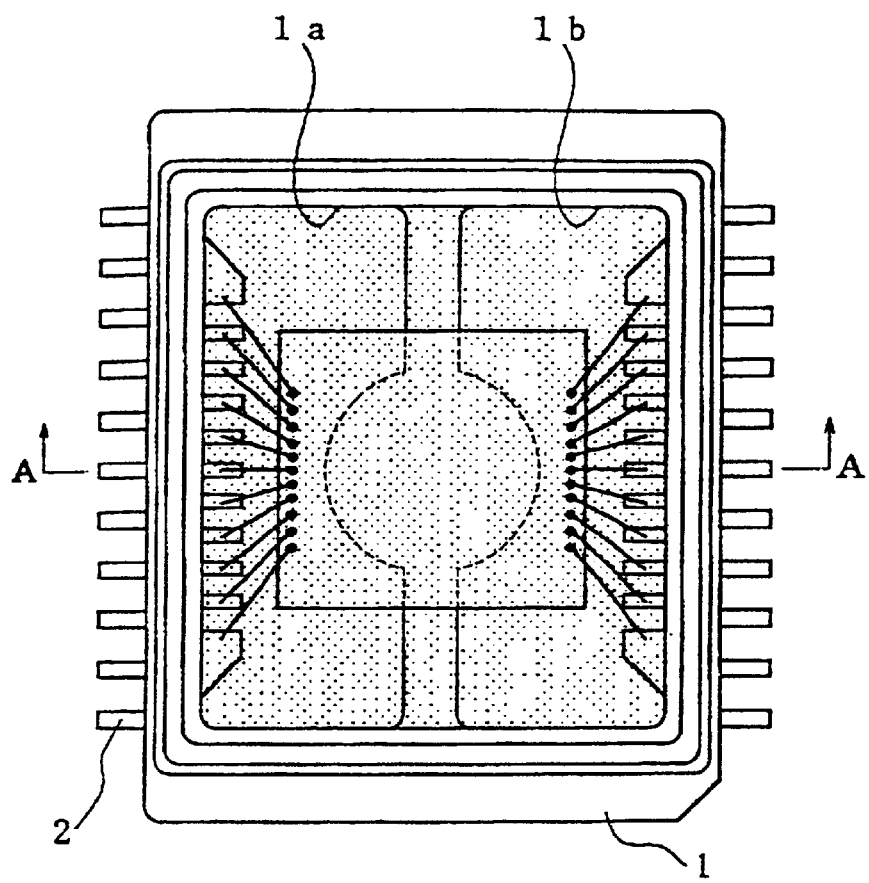
FIG. 1(*a*) is a plan view of a first embodiment of an optical sensing device according to the invention.
Figure 1:
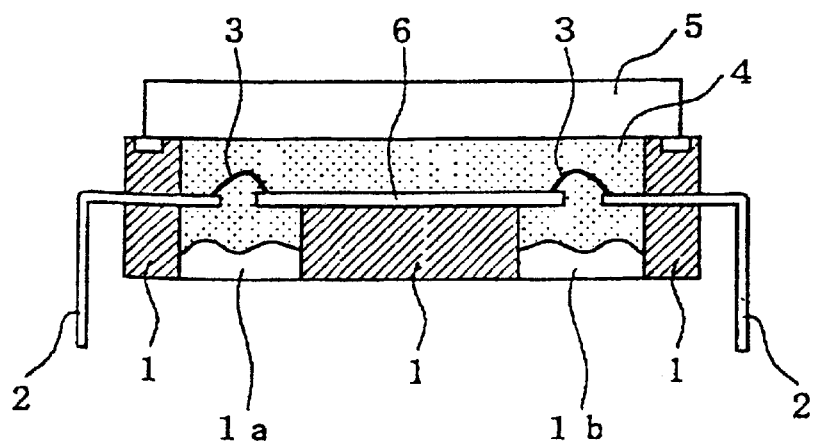

Referring to FIGS. 1(*a*) and 1(*b*), a plastic casing 1 has a fully open upper face and a partly open bottom face. The bottom face is open except at bonding portion of a semiconductor optical sensor chip 6 and the supporting portions of the bonding portion. In the other words, the plastic casing 1 has holes 1*a* and 1*b* in the bottom thereof. Lead frames 2, which provide wiring connections extend from the inside to the outside of the plastic casing 1.

A semiconductor optical sensor chip 6 such as a CCD image sensor, a photodiode or an infrared sensor is bonded onto the bottom of the plastic casing 1. The bottom face of the plastic casing 1 is open except at the bonding portion where the semiconductor optical sensor chip 6 is bonded and the supporting portions which connect the bonding portion to the peripheral portion of the plastic casing 1. The internal terminals of the sensor chip 6 and the lead frames 2 are connected with each other via bonding wires 3.

A transparent plate 5 is fixed onto the upper edge portion of the plastic casing 1 by adhesive or by welding. The plastic casing 1 is filled with transparent silicone gel 4 as a transparent filler. The transparent silicone gel 4 is exposed to the external environment through the holes 1a and 1b.

In this embodiment of the invention, the plastic casing 1 is completely filled with the transparent silicone gel 4, which completely seals and protects the sensor chip 6 and the bonding wires 3. Thus, the conventional sealant gas which may adversely affect the sensor chip is eliminated, and stable properties of the sensor chip are maintained.

By virtue of the above-described structure, only volume change of the silicone gel 4 due to temperature change is accommodated by the expansion or the contraction of the exposed portions of the silicone gel 4 in the holes 1a and 1b. Therefore, in contrast to the conventional sensing device structure which completely encloses the transparent filler (transparent resin) in the casing, the sensing device structure according to the present invention prevents air being sucked into the casing and forming bubbles in the filler.

Moreover, since the transparent plate 5 is fixed onto the upper face of the casing 1, the distance between the surface of the transparent plate 5 and the surface of the sensor chip 6 remains constant when the transparent silicone gel 4 expands or contracts. Therefore, the volume change of the transparent silicone gel 4 does not alter the optical properties of the sensing device, and stable operation of the sensing device is facilitated.

The optical sensing device is manufactured in the following manner. Metal plates (lead frames 2) are inserted in a molding die and the plastic casing 1 is formed on the lead frames 2 in the molding die by injection molding of a thermoplastic resin. The semiconductor optical sensor chip 6 is bonded to the plastic casing 1, and the bonding wires 3 are bonded. The transparent plate 5 is affixed to the plastic casing 1 with an adhesive or welded to the plastic casing 1 with a solvent or by ultrasonic welding. For facilitating welding, it is preferable for the plastic casing 1 and the transparent plate 5 to be made of the same material. Then, the plastic casing 1 is positioned upside-down and the transparent silicone gel 4 is injected, before curing, into the plastic casing 1 through the holes 1a and 1b. Finally, the transparent silicone gel 4 is cured. Curing may be done thermally in a thermostat, chemically, or by exposure to ultra violet energy.

Figure 2:
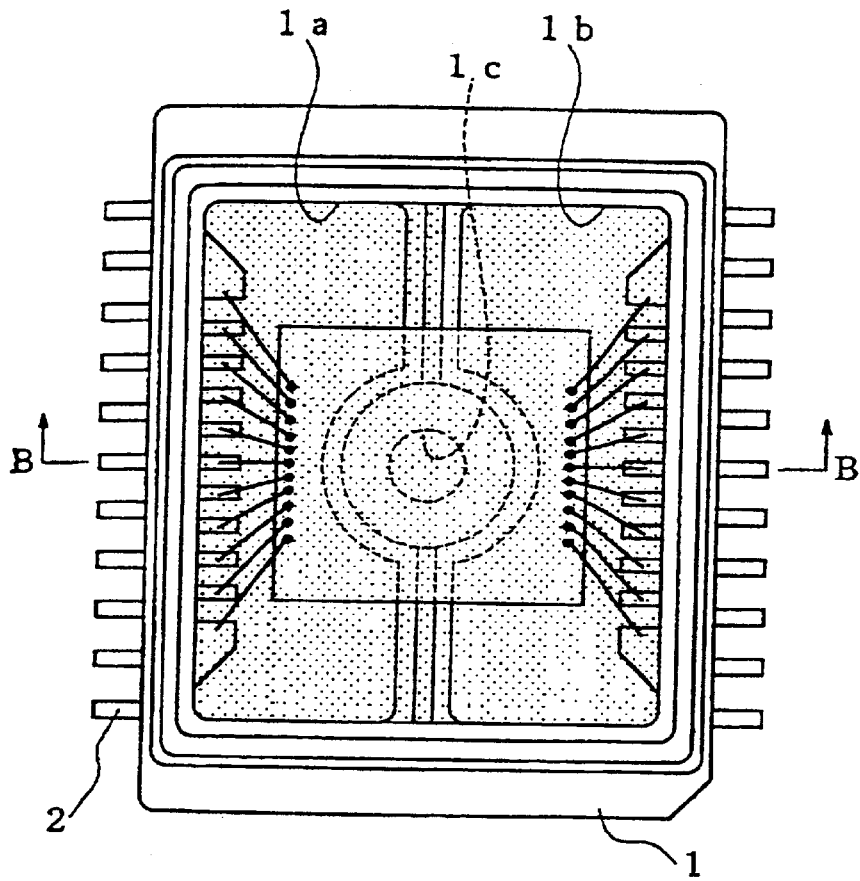
FIG. 2(*a*) is a plan view of a second embodiment of an optical sensing device according to the invention.
Figure 2:
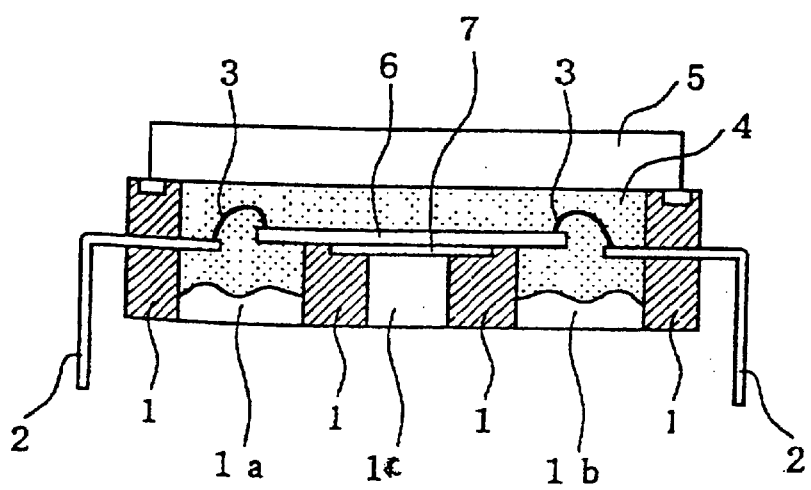

Referring now to FIGS. 2(a) and 2(b), a second embodiment of the optical sensing device of the present invention includes, in addition to the constituent elements of the first embodiment, a metal die pad 7 in the bonding position of the sensor chip 6. The metal die pad 7 grounds the package potential of the sensor chip 6 or improves the adhesion between the sensor chip 6 and the plastic casing 1.

A hole 1c is formed in the portion of the plastic casing 1 below the location of metal die pad 7. A pin (not shown) is inserted into the hole 1c to support the metal die pad 7 to support the metal die pad 7 it from being displaced by the injected resin during the injection molding. The other components of the device are the same as those of the optical sensing device of the first embodiment.

Figure 3:
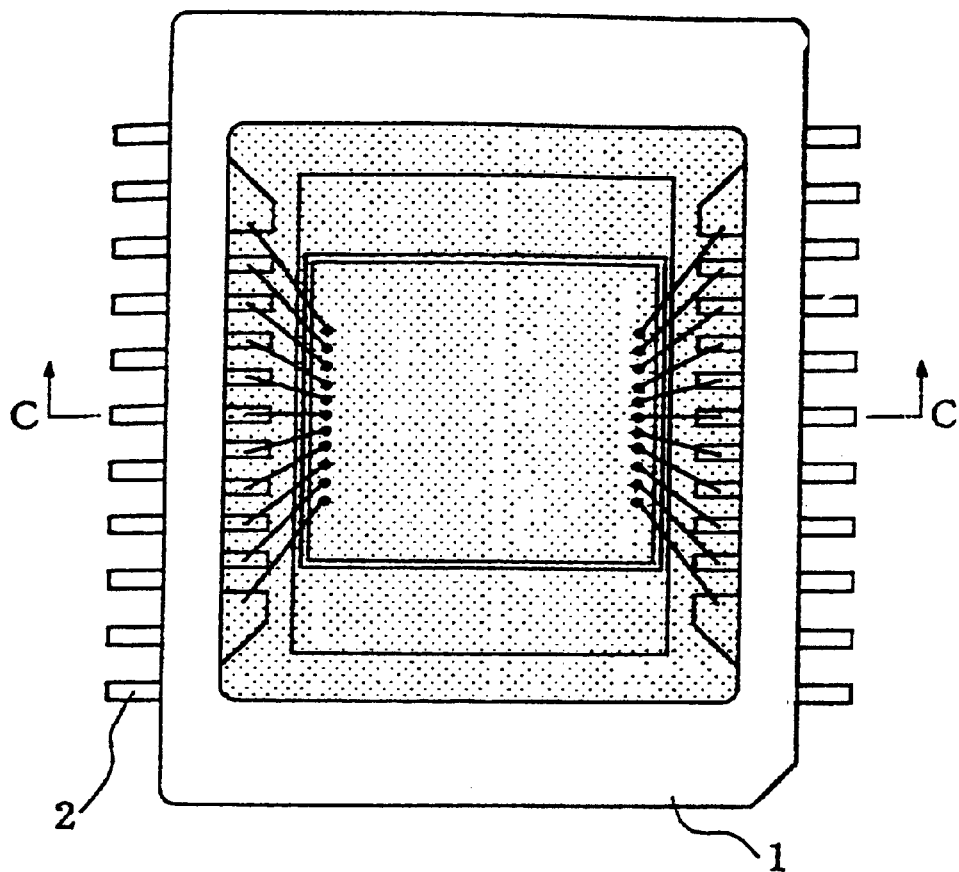
FIG. 3(*a*) is a plan view of a third embodiment of an optical sensing device according to the invention.
Figure 3:
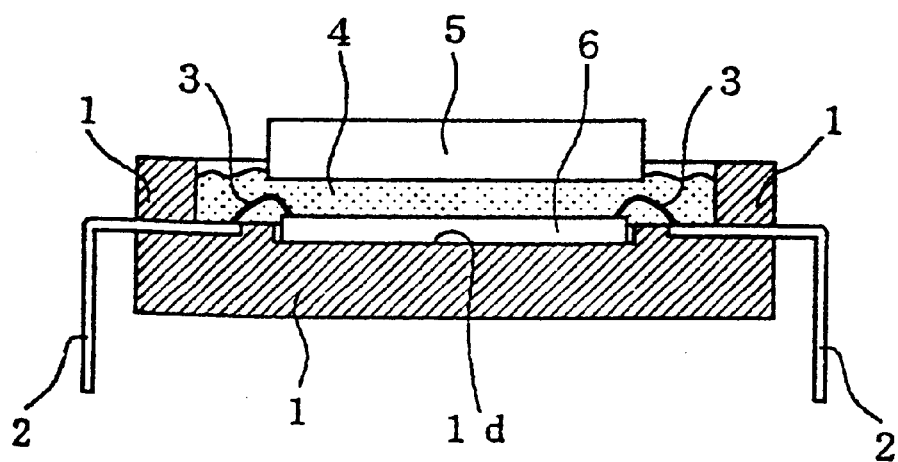

Referring now to FIGS. 3(a) and (b), lead frames 2 extend from the inside to the outside through a plastic casing 1. A recess portion 1d for bonding a semiconductor optical sensor chip 6 is formed in the bonding position of the semiconductor optical sensor chip 6 in the bottom of the plastic casing 1. The semiconductor optical sensor chip 6 is bonded to the recess portion 1d. Internal terminals on the sensor chip 6 are connected to the lead frames 2 via bonding wires 3.

The plastic casing 1 is filled with a transparent silicone gel 4. A transparent plate 5 is bonded to the central surface portion of the transparent silicone gel 4 such that the transparent plate 5 floats on the transparent silicone gel 4 out of contact with the plastic casing 1. To describe in the other words, the transparent plate 5 contacts the central part of the surface of the transparent silicone gel 4, leaving the peripheral part of the surface of the transparent silicone gel 4 exposed to the environment.

In the third embodiment of FIGS. 3(a) and 3(b), the plastic casing 1 is completely fined with the transparent silicone gel 4, which completely seals and protects the sensor chip 6 and the bonding wires 3. The gap about the perimeter permits expansion and contraction of the transparent silicone gel 4 without changing the optical properties. The conventional sealant gas which may adversely affect the sensor chip is eliminated, and stable properties of the sensor chip are maintained.

A part of the upper face of the plastic casing 1 is open to the environment and a part of the transparent silicone gel is exposed. By virtue of the above described structure, any expansion or contraction of the silicone gel 4 due to temperature change is absorbed by raising or lowering the exposed face of the silicone gel 4 and by the elevation or the lowering of the transparent plate 5. Therefore, in contrast to the conventional sensing device structure which completely encloses the transparent filler (transparent resin) in the casing, the sensing device structure according to this embodiment of the invention prevents bubbles from forming in the filler due to air being sucked into the casing.

If necessary, a metal die pad may be disposed at the bonding position of the sensor chip 6 in the bottom of the plastic casing 1.

Although not illustrated in FIGS. 3(a) and 3(b), holes 1a and 1b as shown in FIG. 1(b) may be formed in the bottom of the casing 1.

Figure 4:
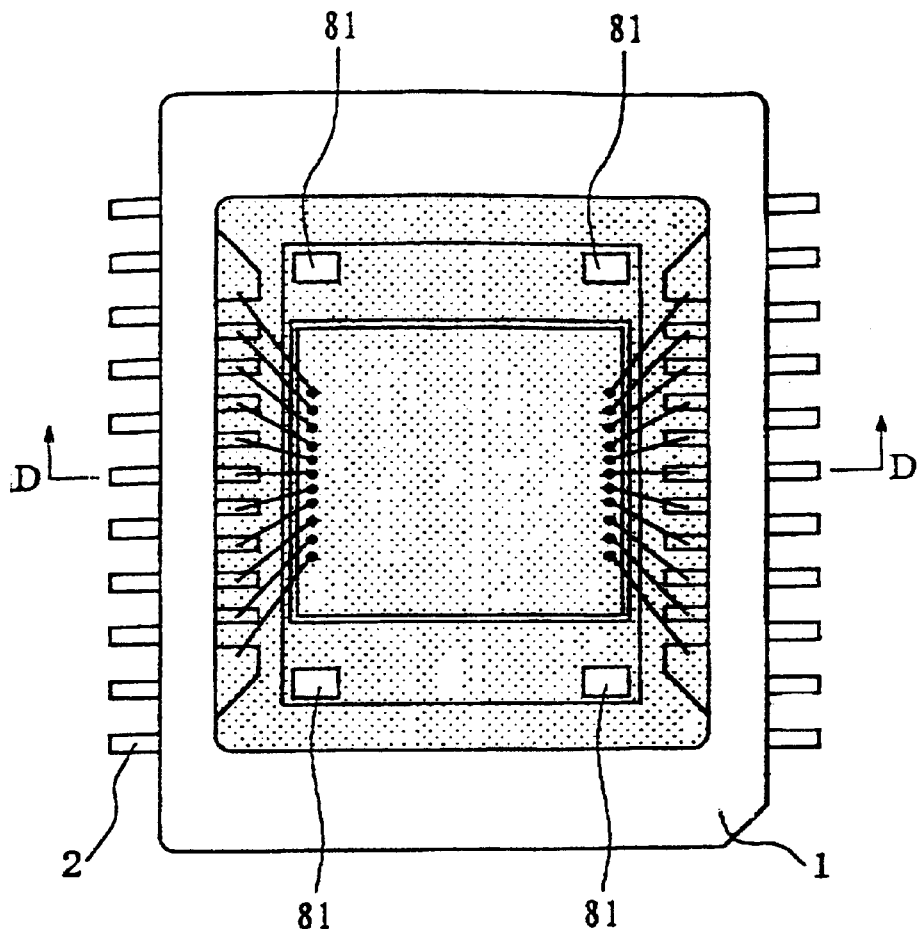
FIG. 4(*a*) is a plan view of a fourth embodiment of an optical sensing device according to the invention.
Figure 4:
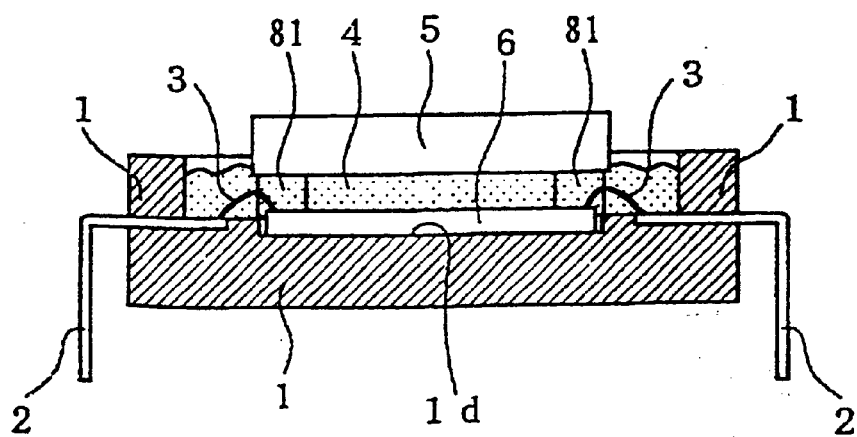

Referring now to FIGS. 4(a) and (b), a fourth embodiment of the invention a part of the upper face of a plastic casing 1 is open and a transparent plate 5 is supported at its four comers by supporting columns 81 projecting from the bottom of the casing 1.

Lead frames 2 extends from the inside to the outside through a plastic casing 1. A recess portion 1d for bonding a semiconductor optical sensor chip 6 is formed in the bonding position of the sensor chip 6 in the bottom of the plastic casing 1. The sensor chip 6 is bonded to the bottom of the recess portion 1d. Internal terminals on the sensor chip 6 are connected to the lead frames 2 via bonding wires 3.

The plastic casing 1 is filled with a transparent silicone gel 4. The transparent plate 5 on the central surface portion of the transparent silicone gel 4 is fixed to the plastic casing 1 via the supporting columns 81. The transparent plate 5 is not in direct contact with the plastic casing 1. The bottom surface of the transparent plate 5 is in contact with the upper surface of the transparent silicone gel 4.

In this fourth embodiment, the plastic casing 1 is completely fined with the transparent silicone gel 4, which completely seals and protects the sensor chip 6 and the bonding wires 3. Thus, the conventional sealant gas which may adversely affect the sensor chip is eliminated, and stable properties of the sensor chip are maintained.

The expansion or contraction of the silicone gel 4 due to temperature changes is absorbed by the elevation or the lowering of the exposed face of the silicone gel 4. Again, in contrast to the conventional sensing device structure which completely encloses the transparent filler (transparent resin) in the casing, bubble formation is prevented.

Since the transparent plate 5 is fixed to the bottom of the casing 1 via the supporting columns 81, the distance between the surface of the transparent plate 5 and the surface of the sensor chip 6 does not change when the transparent silicone gel 4 expands or contracts. Therefore, the volume change of the transparent silicone gel 4 does not alter the optical properties of the sensing device, and stable operation of the sensing device is maintained.

If necessary, a metal die pad may be disposed at the bonding position of the sensor chip 6 in the bottom of the plastic casing 1.

Figure 5:
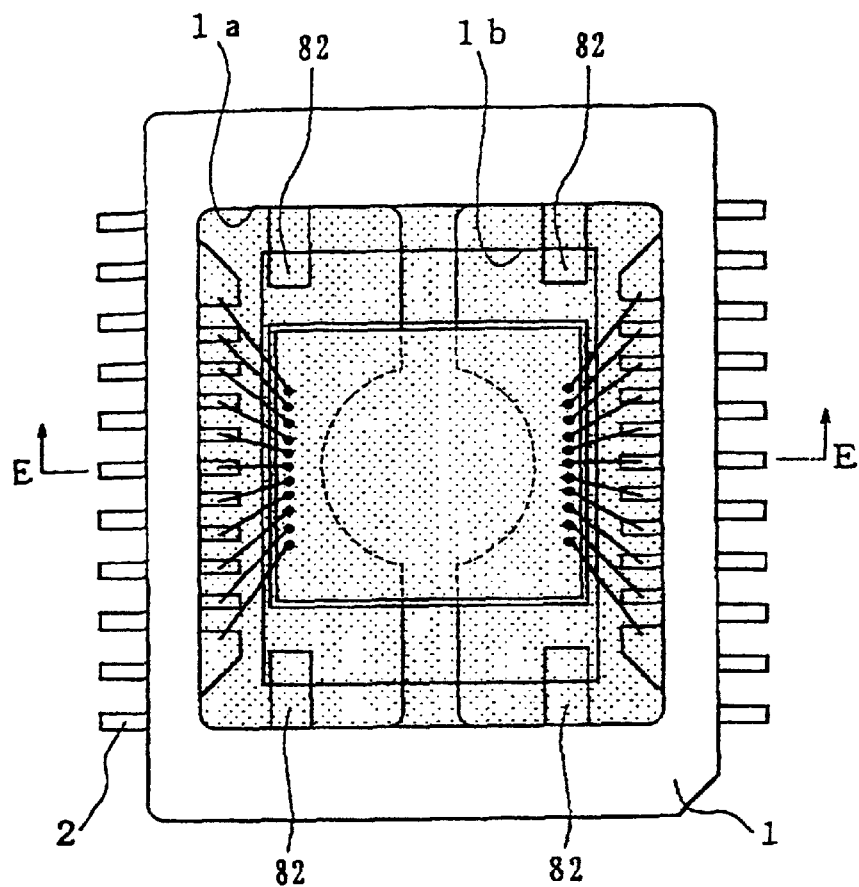
FIG. 5(*a*) is a plan view of a fifth embodiment of an optical sensing device according to the invention.
Figure 5:
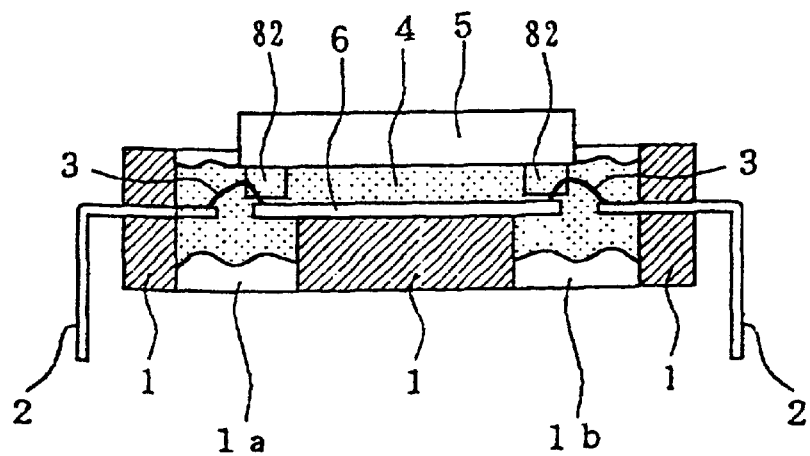

In a fifth embodiment of the invention, shown in FIGS. 5(a) and (b), the upper face of a plastic casing 1 is open to the environment. A transparent plate 5 is supported in the middle of the open upper face of the casing 1 by supporting columns 82 extending inward from two internal side faces of the casing 1. Lead frames 2 extend from the inside to the outside through the casing 1. The bottom face of the plastic casing 1 is open except for the bonding portion where a semiconductor optical sensor chip 6 is bonded, and the supporting portions which fix the bonding portion to the peripheral portion of the casing 1.

In this fifth embodiment, the plastic casing 1 includes holes 1a and 1b bored in the bottom thereof. Internal terminals on the sensor chip 6 are connected to the lead frames 2 via bonding wires 3.

The plastic casing 1 is filled with a transparent silicone gel 4. The transparent plate 5 on the central surface portion of the transparent silicone gel 4 is fixed to the plastic casing 1 via supporting columns 82. The transparent plate 5 is not in direct contact with the plastic casing 1. The bottom surface of the transparent plate 5 is in contact with the surface of the transparent silicone gel 4.

In the fifth embodiment, the plastic casing 1 is completely filled with the transparent silicone gel 4, which completely seals and protects the sensor chip 6 and the bonding wires 3. Thus, the conventional sealant gas which may adversely affect the sensor chip is eliminated, and stable properties of the sensor chip are maintained.

In the fifth embodiment, both the upper and bottom faces of the casing 1 are open and the transparent silicone gel 4 is exposed to the environment through the open faces. Thus, any volume change of the silicone gel 4 due to temperature change is absorbed by the elevation or the lowering of the exposed lower faces of the silicone gel 4 and bubble formation is prevented.

Since the transparent plate 5 is fixed to the internal side faces of the casing 1 via the supporting columns 82, the distance between the surface of the transparent plate 5 and the surface of the sensor chip 6 remains constant when the transparent silicone gel 4 expands or contracts. Therefore, the volume change of the transparent silicone gel 4 does not alter the optical properties of the sensing device, and stable operation of the sensing device is maintained.

If necessary, a metal die pad may be disposed at the bonding position of the sensor chip 6 in the bottom of the plastic casing 1, as in prior embodiments.

Figure 6A:
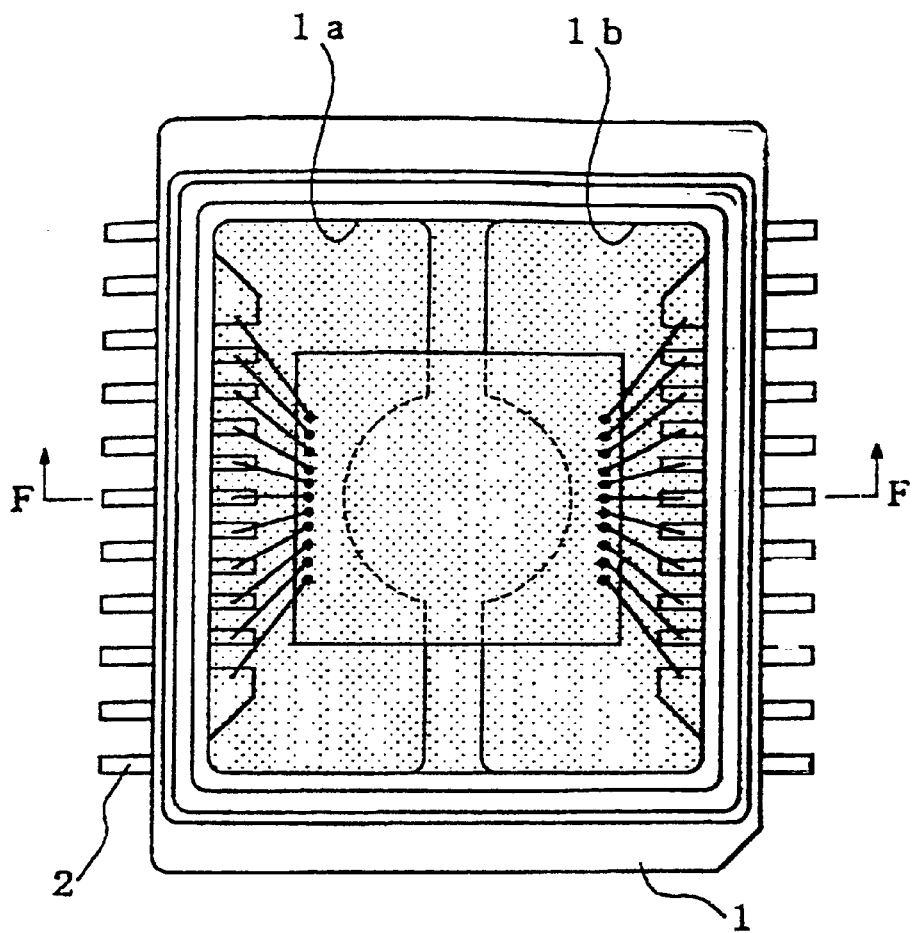
FIG. 6(*a*) is a plan view of a sixth embodiment of an optical sensing device according to the invention.
Figure 6B:
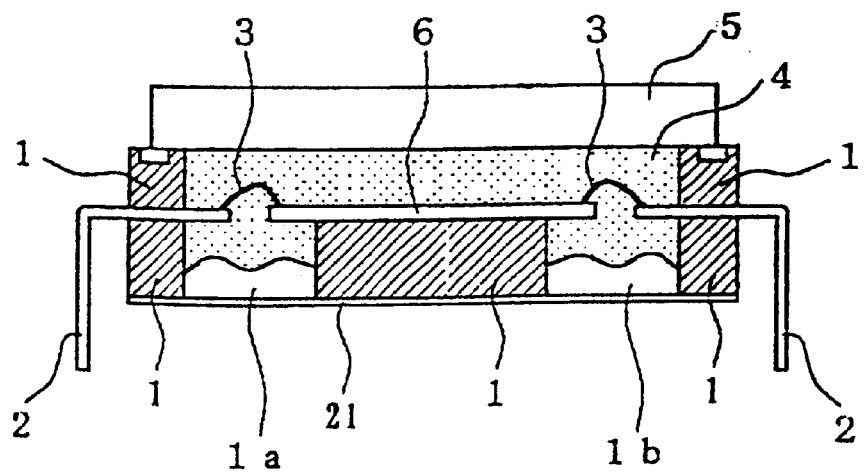

In a sixth embodiment of the invention, shown in FIGS. 6(a) and (b), the optical sensing device further includes a thin film 21 disposed on the bottom surface of the casing 1 such that the thin film 21 closes the holes 1a and 1b of the optical sensing device. The thin film 21 prevents moisture and foreign substances from coming into the casing 1. This protects the transparent silicone gel 4 from air, moisture and contaminants. The portions of the thin film 21 which close the holes 1a and 1b expand or contract in response to the expansion or contraction of the transparent silicone gel 4.

The thin film 21 is made of rubber, plastic or synthetic resin. Preferably, the thin film 21 is colored black, for example, to block light.

Figure 7A:
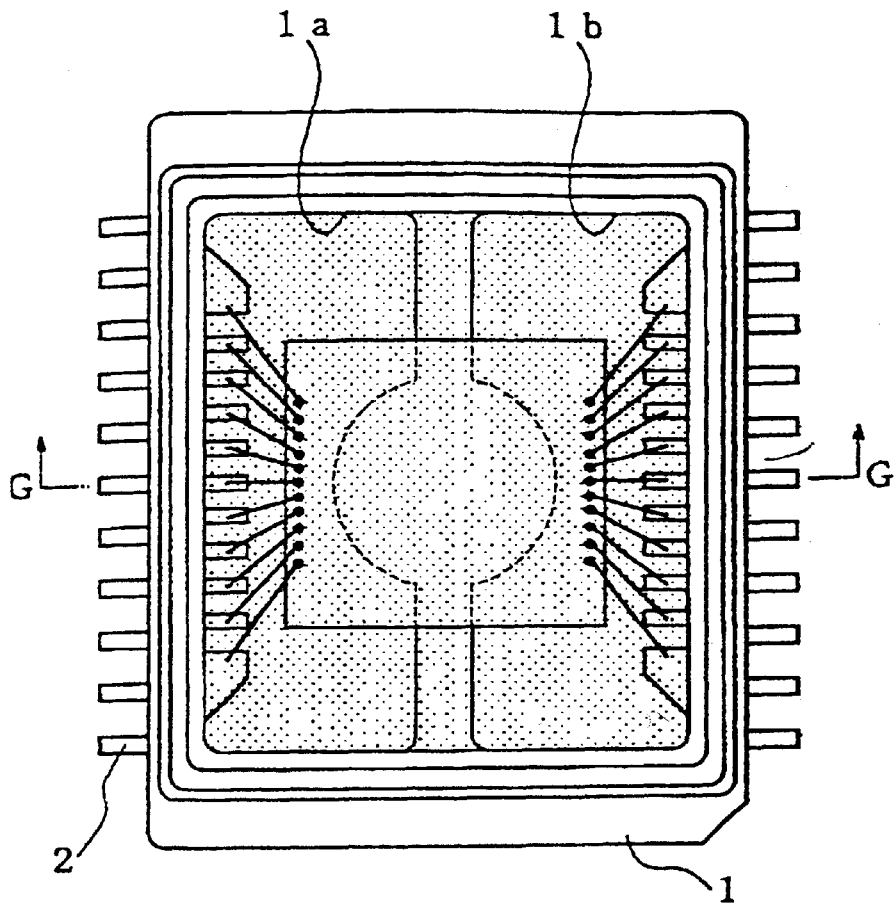
FIG. 7(*a*) is a plan view of a sixth embodiment of an optical sensing device according to the invention.
Figure 7B:
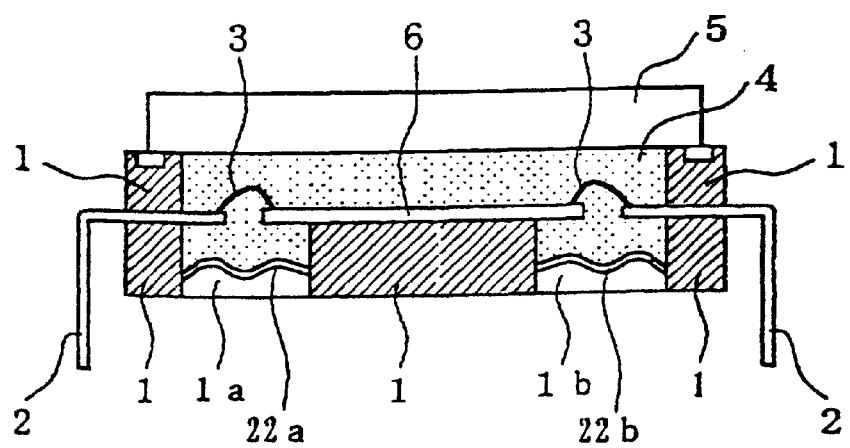

In a seventh embodiment of the invention, shown in FIGS. 7(a) and (b), the optical sensing device further includes coating films 22a and 22b, such as rubber films and synthetic resin films formed on the surface portions of the transparent silicone gel 4 in the holes 1a and 1b. The coating films 22a and 22b prevent moisture and foreign alien substances from entering the casing 1, thus protecting the transparent silicone gel 4. The coating films 22a and 22b advance or retract in response to the expansion or contraction of the transparent silicone gel 4.

Figure 8A:
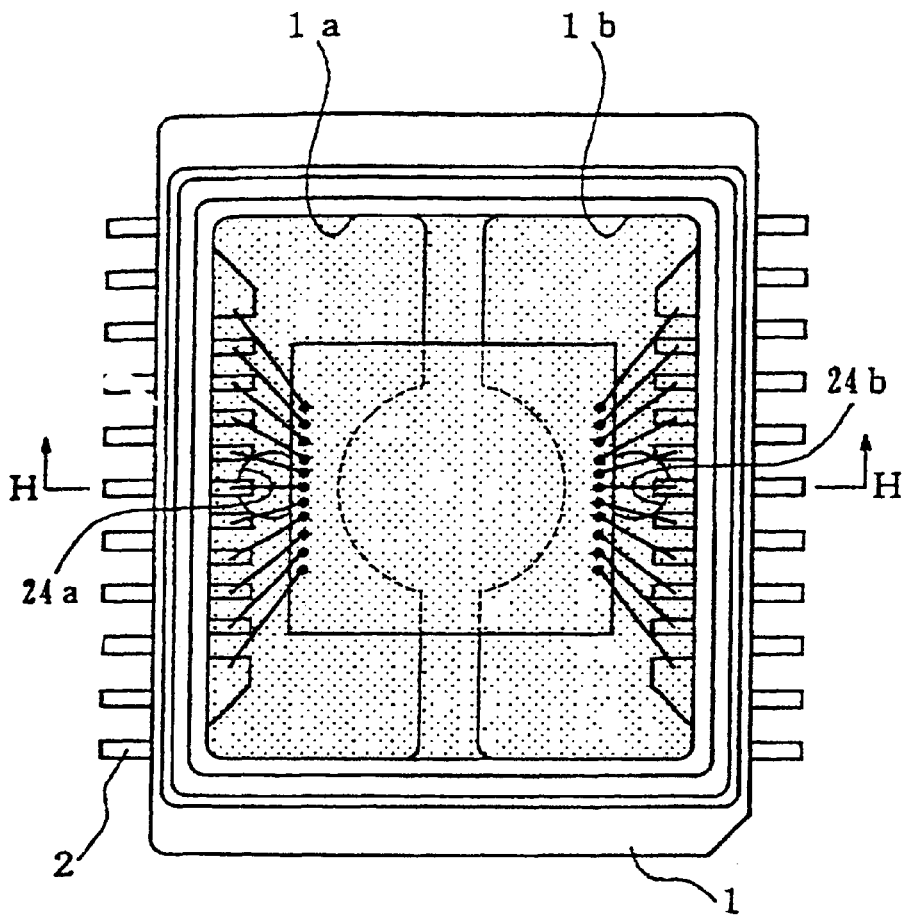
FIG. 8(*a*) is a plan view of an eighth embodiment of an optical sensing device according to the invention.
Figure 8B:
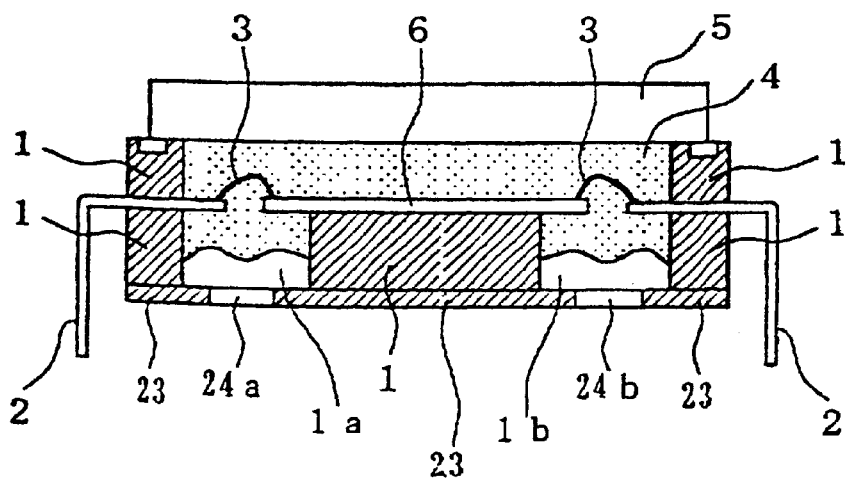
Figure 9A:
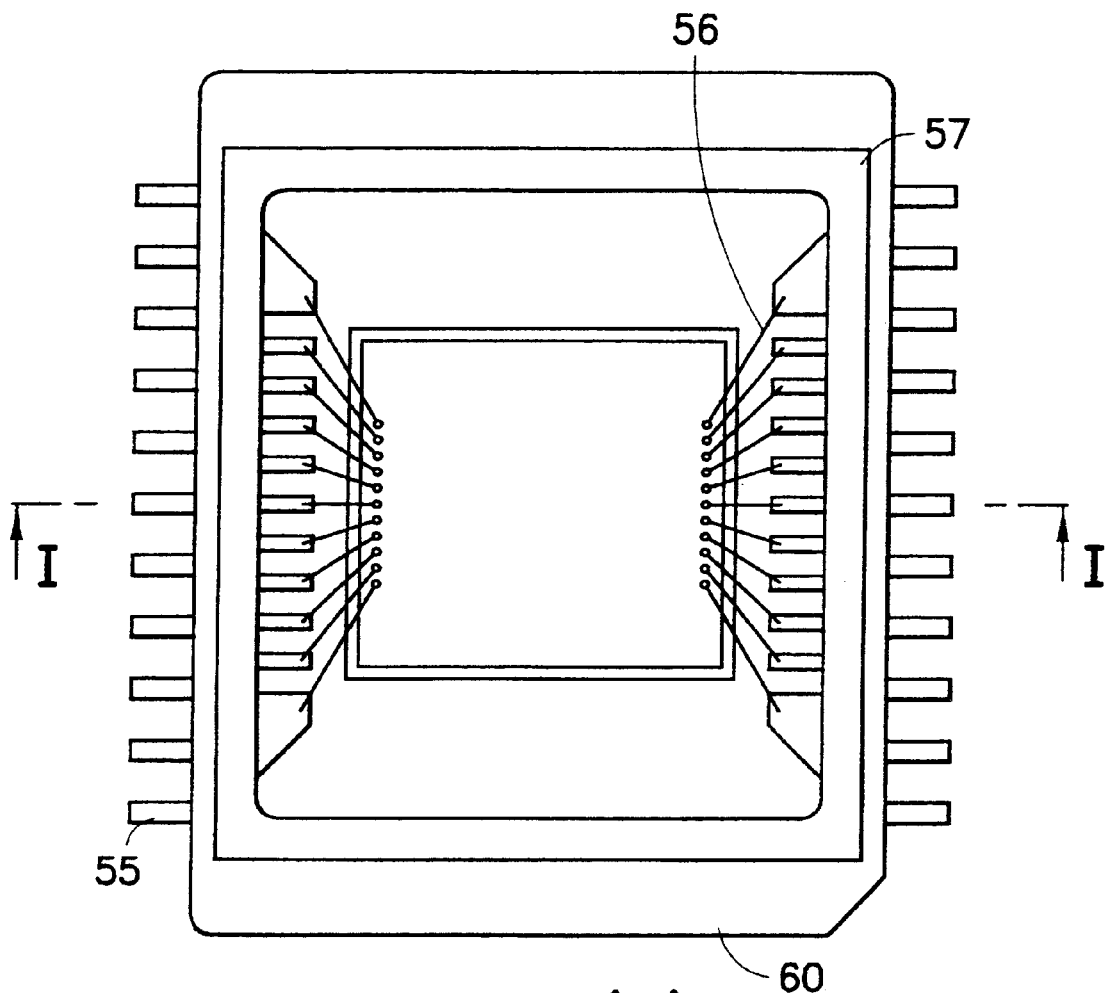
FIG. 9(*a*) is a plan view of a CCD image sensor packaged in a conventional ceramic casing.
Figure 9B:
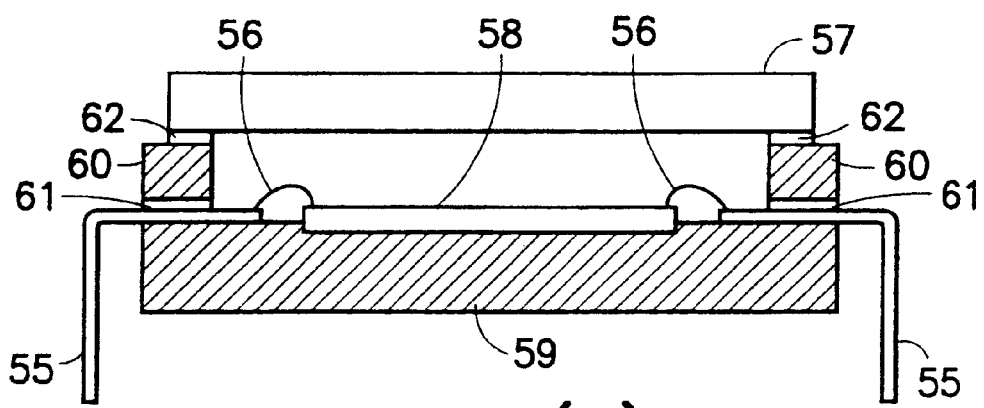

In an eighth embodiment of the invention, shown in FIGS. 8(a) and (b), the optical sensing device further includes a protector plate 23 in which holes 24a and 24b are bored. The protector plate 23 is disposed on the bottom surface of the casing 1 of the optical sensing device, such that the holes 24a and 24b communicate with the respective holes 1a and 1b. Preferably, the sizes of the holes 24a and 24b are small enough to prevent moisture and foreign substances from entering the casing 1 and damaging or contaminating the transparent silicone gel 4.

A metal die pad may be disposed at the bonding position of the sensor chip 6 in the bottom of the casing 1 of the optical sensing device of the sixth, seventh or eighth embodiments.

Characteristic elements of the third, fourth and fifth embodiments may be added to optical sensing devices arranged in accord with the sixth, seventh and eighth embodiments.

Figure 10A:
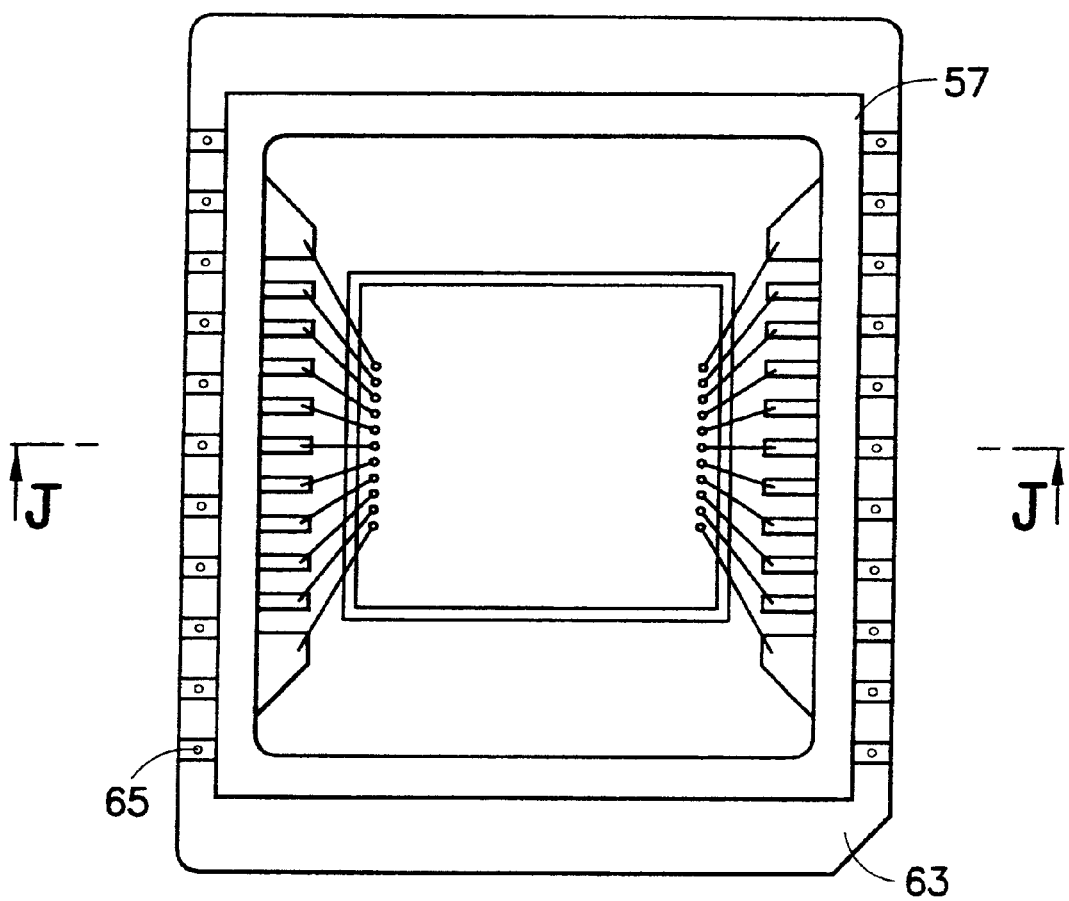
FIG. 10(*a*) is a plan view of a CCD image sensor packaged in another conventional ceramic casing.
Figure 10B:
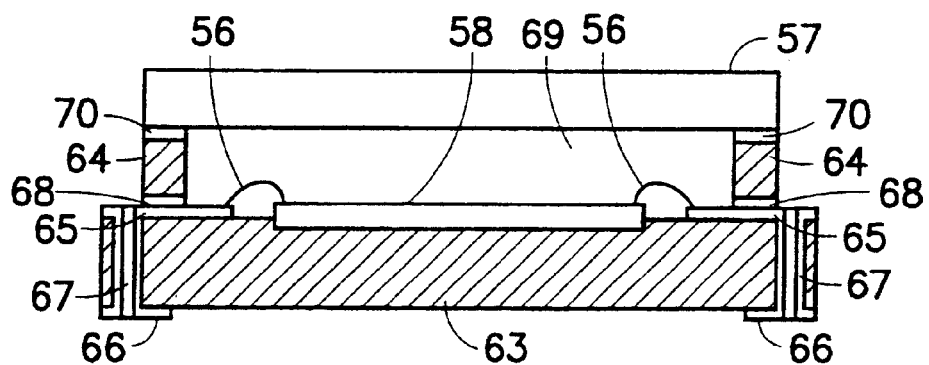

Thus, while the invention has been described so far with reference to specific embodiments, the description is illustrative and is not to be construed as limiting the invention. For example, the invention is applicable to optical sensing devices which include a surface-mounting type casing, of the type illustrated in FIG. 10, filled with a transparent filler.

Although the transparent filler has been described as a transparent silicone gel, transparent silicone rubber, transparent synthetic resin and other such transparent materials may be used.

Although the casing has been described as a plastic casing, ceramics, composite material of ceramics and plastics and other such materials may be used.

Although the manufacture of the optical sensing devices according to the present invention has been described as injection molding of thermoplastic resin, the invention may also be manufactured by casting of thermosetting resin.

Although the connection of the internal terminals on the sensor chip and the wiring pattern on the insulating casing has been described as wire bonding, connection by controlled collapse bonding (CCB) may be also applicable.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor optical sensing device package comprising:

an insulating casing;

wiring extending from inside to outside of said casing;

a semiconductor optical sensor chip fixed inside said casing;

a plurality of terminals disposed on said sensor chip;

connecting means for connecting said terminals and said wiring;

a quantity of transparent filler, said filler filling said casing and covering an upper face of said sensor chip;

a transparent plate disposed above said sensor chip, said transparent filler being interposed between said sensor chip and said transparent plate; and at least one hole communicating between said transparent filler and an environment exterior of said casing.

2. A semiconductor optical sensing device package according to claim 1, wherein said at least one hole is in a bottom of said insulating casing.

3. The semiconductor optical sensing device package according to claim 1, wherein a part of the upper surface of said transparent filler is not in contact with said transparent plate and said part of said upper surface is exposed to the environment.

4. The semiconductor optical sensing device package according to claim 2, further comprising support columns projecting from said casing and supporting said transparent plate.

5. The semiconductor optical sensing device package according to claim 3, further comprising support columns projecting from said casing and supporting said transparent plate.

6. The semiconductor optical sensing device package according to claim 1, wherein said transparent filler is exposed to the environment through said at least one hole.

7. The semiconductor optical sensing device package according to claim 1, wherein said at least one hole is in a bottom of said casing, the package further comprising a film on a bottom surface of said casing, said film covering said at least one hole.

8. The semiconductor optical sensing device package according to claim 1, further comprising coating films on surface portions of said transparent filler, said surface portions being in said at least one hole.

9. The semiconductor optical sensing device package according to claim 1, wherein said transparent filler comprises transparent silicone gel.

10. The semiconductor optical sensing device package according to claim 2, wherein said transparent filler comprises transparent silicone gel.

11. The semiconductor optical sensing device package according to claim 2, wherein the bottom of said casing is provided with a plurality of holes, said holes communicating between said transparent filler and the environment.

12. The semiconductor optical sensing device package according to claim 11, wherein said transparent filler is exposed to the environment through said holes.

13. A semiconductor optical sensing device package comprising:

an insulated casing;

wiring extending from an inside to an outside of said casing;

a semiconductor optical sensor chip fixed inside said casing;

a plurality of terminals on said sensor chip;

connecting means for connecting said terminals and said wiring;

a quantity of transparent filler, said filler filling said casing and covering an upper face of said sensor chip; and a transparent plate disposed above said sensor chip with said transparent filler interposed between said transparent plate and said sensor chip such that a part of an upper surface of said transparent filler is not in contact with said transparent plate and said part of said upper surface is exposed to an environment external of the insulating casing.

14. An optical package comprising:

a concave casing;

an optical device in a bottom of said casing;

a transparent filler covering said optical device;

a transparent plate atop said transparent filler aligned over said optical device, whereby said optical device is enabled to interact optically with an exterior environment;

a gap communicating between said exterior environment and said transparent filler; and said gap permitting expansion and contraction of said transparent filler without distorting optical properties of said transparent plate and said transparent filler.

15. An optical package according to claim 14, wherein said gap is about a perimeter of said transparent plate.

16. An optical package according to claim 14, wherein said gap is in said bottom.

17. An optical package according to claim 14 further comprising a film between said transparent filler and exterior environment, whereby said transparent filler is protected from contamination by said exterior environment.

18. An optical package according to claim 14 wherein said casing is a resin molded on wiring extending between inside and outside said casing.

* * * * *